(12) United States Patent
Kurita

(10) Patent No.: US 6,781,909 B2
(45) Date of Patent: Aug. 24, 2004

(54) SEMICONDUCTOR MEMORY DEVICE AND METHOD FOR CONTROLLING SEMICONDUCTOR MEMORY DEVICE

(75) Inventor: Yuji Kurita, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 35 days.

(21) Appl. No.: 10/373,858

(22) Filed: Feb. 27, 2003

(65) Prior Publication Data

US 2004/0027888 A1 Feb. 12, 2004

(30) Foreign Application Priority Data

Aug. 8, 2002 (JP) ........................................ 2002-231646

(51) Int. Cl.[7] .............................................. G11C 7/00
(52) U.S. Cl. ...................................... 365/222; 365/228
(58) Field of Search ................................ 365/222, 227, 365/228, 229

(56) References Cited

U.S. PATENT DOCUMENTS 5,859,809 A * 1/1999 Kim ............................ 365/222
6,229,747 B1 * 5/2001 Cho et al. .................... 365/222
6,515,928 B2 * 2/2003 Sato et al. .................... 365/222

* cited by examiner

*Primary Examiner*—Tan T. Nguyen
(74) *Attorney, Agent, or Firm*—Arent Fox PLLC

(57) ABSTRACT

A semiconductor memory device, which performs refreshing for data retention, provided with a power down mode that stops refreshing. The device includes a request generation circuit, which generates a refresh request signal with an oscillation signal generated by an oscillation circuit. The oscillation circuit stops generation of the oscillation signal in response to a power down mode entry signal. This reduces the current consumption of the semiconductor memory device.

28 Claims, 14 Drawing Sheets

SEMICONDUCTOR MEMORY DEVICE AND METHOD FOR CONTROLLING SEMICONDUCTOR MEMORY DEVICE

CROSS-REFERENCE TO RELATED APPLICATIONS

This application is based upon and claims the benefit of priority from the prior Japanese Patent Application No. 2002-231646, filed on Aug. 8, 2002, the entire contents of which are incorporated herein by reference.

BACKGROUND OF THE INVENTION

The present invention relates to a semiconductor memory device, and more particularly, to a semiconductor memory device provided with a power down mode that stops refreshing, which is performed to retain data, while activating an internal power supply.

A dynamic random access memory (DRAM) is often used in lieu of a static random access memory (SRAM) in portable electronic devices, such as a cellular phone. A system including a DRAM periodically refreshes the memory cells of the DRAM to retain data. Recent DRAM systems enter a first standby state in which data retention is required and a second standby state in which data retention is not required. The refreshing of the DRAM in the second standby state consumes current in an unnecessary manner. To reduce power consumption in the second standby state, a DRAM provided with a power down mode, which includes a refresh stop mode (nap mode) and a sleep mode, has been developed. The refresh stop mode inactivates circuits required for refreshing. The sleep mode stops the supply of internal power.

FIG. 1 is a schematic block diagram showing a prior art DRAM 60, which is provided with a power down mode. The DRAM 60 includes a self-refresh control circuit 61, a power down control circuit 62, an internal power generation circuit 63, a refresh control circuit 64, a main circuit 65, and a NOR circuit 70.

The self-refresh control circuit 61, which includes an OSC control circuit 66, an oscillation circuit 67, a cycle counter 68, and a request generation circuit 69, generates a refresh request signal req in a predetermined cycle.

The OSC control circuit 66 includes a PMOS transistor TP1 and a resistor R1, which are connected in series between a power supply and the ground. The gate terminal of the PMOS transistor TP1 is connected to its drain terminal, from which an oscillation frequency control signal VR is output. The control signal VR is set by the current (constant current) I that flows through the PMOS transistor TP1 and the resistor R1. It is preferred that the current I be relatively small to perform a low current consumption operation. For example, the resistor R1 has 10 MΩ and the current I has several microamperes (e.g., 1 microampere).

The oscillation circuit 67 includes an odd number (three in FIG. 1) of inverter circuits 71, 72, 73, which are connected in a looped manner to configure a ring oscillator. The power supply terminals of the inverter circuits 71 to 73 are respectively connected to the power supply via PMOS transistors TP2, TP3, and TP4. The gate terminals of the PMOS transistors TP2 to TP4 are provided with the oscillation frequency control signal VR. The transistors TP2 to TP4 supply the inverter circuits 71 to 73 with control current in accordance with the control signal VR. The ring oscillator, which is configured by the inverter circuits 71 and 73, functions in this manner to produce an oscillation signal OSC. The oscillation signal OSC is provided to the cycle counter 68. The cycle counter 68 counts the pulse number of the oscillation signal to determine a refresh cycle. The request generation circuit 69 outputs a request signal req in each refresh cycle, which is determined by the cycle counter 68.

The power down control circuit 62 determines whether an external signal (not shown) represents a power down mode to generate a nap mode entry signal NAPe or a sleep mode entry signal SLEEPe.

The NOR circuit 70 has a first input terminal, which is provided with the request signal req from the request generation circuit 69, and a second input terminal, which is provided with the entry signal NAPe of the nap mode from the power down control circuit 62.

The NOR circuit 70 provides the refresh control circuit 64 with the request signal req. The refresh control circuit 64 controls self-refresh in response to the request signal req.

The main circuit 65 includes a DRAM core 65a, which includes a memory cell array, a row decoder, a column decoder, and a sense amplifier. The refresh control circuit 64 activates each word line in the DRAM core 65a and refreshes the data stored in the memory cells connected to the activated word line.

The internal power generation circuit 63 generates power supply voltage, which is supplied to the DRAM core 65a and its peripheral circuits, and internal power, such as the negative potential supplied to the substrate to activate the DRAM 60 or a boosting potential. In other words, the internal power generation circuit 63 generates power supply voltage for operating the self-refresh control circuit 61, the main circuit 65, and the refresh control circuit 64. The power down control circuit 62 provides the internal power generation circuit 63 with the sleep mode entry signal SLEEPe. This inactivates the power generation circuit 63, stops the generation of the power supply voltage, and stops the refresh operation of the memory cells. The power supply voltage for operating the power down control circuit 62 is generated by another internal power generation circuit (not shown).

The operation of the DRAM 60 will now be discussed.

(Nap Mode)

When the entry signal NAPe provided from the power down control circuit 62 to the NOR circuit 70 has a high level (the nap period between time t11 to time t12 in FIG. 2), the NOR circuit 70 continuously outputs a signal having a low level. Thus, the refresh control circuit 64 is not provided with the request signal req. This stops the refresh operation of the memory cells and reduces current consumption. In the nap mode, the internal power generation circuit 63 is activated as shown in the state of FIG. 3. Thus, the refresh control circuit 64, the main circuit 65, and the self-refresh control circuit 61 are supplied with power. In this state, the entry signal NAPe of the power down control circuit 62 stops providing the refresh control circuit 64 with the request signal req from the self-refresh control circuit 61 to stop the refresh operation.

(Sleep Mode)

Referring to FIG. 4, when the power down control circuit 62 provides the internal power generation circuit 63 with the entry signal SLEEPe, the internal power generation circuit 63 stops generating power. In this state, the power down control circuit 62 breaks a power line that connects the internal power generation circuit 63 to an external power supply and an internal power line that connects the internal power generation circuit 63 to the circuits 61, 64, and 65.

FIG. 5 illustrates the current consumption in a normal standby mode, the nap mode, and the sleep mode.

In the nap mode, the AC current of the refresh operation is decreased from the current consumption in the normal standby mode. In the sleep mode, the AC current of the oscillation operation in the self-refresh control circuit (self-control circuit) 61 and the DC current of the internal power generation circuit 63 are decreased from the current consumption in the nap mode. That is, in the sleep mode, circuits other than the power down (PD) control circuit 62 (i.e., the circuit required to determine the mode) are disconnected from the power supply and inactivated to reduce current consumption.

Referring to FIG. 6A, during the sleep mode period (sleep period from time t11 to time t12), the internal power generation circuit 63 is inactivated and the internal power voltage is decreased to the ground voltage. Thus, a recovery time (time t12 to t13) of several hundred microseconds is necessary to return the mode to the normal standby mode from the sleep mode and to activate the internal power generation circuit 63 and stabilize the internal power voltage.

Referring to FIG. 6B, during the nap mode period (nap period from time t11 to time t12), the internal power generation circuit 63 is activated. Thus, the mode quickly returns to the normal standby mode from the nap mode. Accordingly, the use of the nap mode is optimal when frequently shifting between an operation mode that requires data retention and an operation mode that does not require data retention.

As described above, in the nap mode, the request signal req is not provided to stop the refresh operation. However, the oscillation circuit 67 and the OSC control circuit 66 of the self-refresh control circuit 61 are continuously activated for the reasons described below.

The oscillation circuit 67 constantly performs the oscillation operation in an asynchronous manner when the internal power generation circuit 63 is activated. Thus, if the oscillation operation of the oscillation circuit 67 is interrupted and subsequently restarted, the oscillation signal OSC would have a cycle that differs from the predetermined oscillation cycle. This may result of erroneous functioning of the refresh control circuit 64. More specifically, if the cycle counter 68 were to perform a count operation in accordance with an oscillation signal OSC having a cycle that differs from the predetermined cycle, the cycle of the request signal req would differentiate from the desired refresh cycle.

The OSC control circuit 66 includes the resistor RI, which has a high resistance. Thus, if the power supply to the OSC control circuit 66 were cut, a predetermined time would be necessary for the oscillation frequency control signal VR to reach a predetermined value when the power supply is started. The oscillation signal OSC that has an oscillation frequency differing from the predetermined frequency is generated during a transition period (instable period) during which the oscillation frequency control signal VR reaches a predetermined value. However, unnecessary current is consumed by stopping only the request signal req to operate the OSC control circuit 66 and the oscillation circuit 67 during the nap mode.

SUMMARY OF THE INVENTION

An aspect of the present invention is a semiconductor memory device, which performs refreshing for data retention, provided with a power down mode that stops refreshing. The device includes an oscillation circuit for generating an oscillation signal. A request generation circuit generates a refresh request signal with the oscillation signal of the oscillation circuit, wherein the oscillation circuit stops generation of the oscillation signal in response to a power down mode entry signal.

A further aspect of the present invention is a semiconductor memory device including a power down control circuit for generating a power down mode entry signal. A refresh control circuit generates a refresh request signal for the semiconductor memory device. The refresh control circuit includes an oscillation circuit for generating an oscillation signal. An oscillation control circuit is connected to the oscillation circuit to generate a control signal for controlling the frequency of the oscillation signal. A cycle counter counts the oscillation signal of the oscillation circuit. A request generation circuit is connected to the cycle counter to generate the refresh request signal in accordance with a count value. The oscillation circuit stops generation of the oscillation signal in response to the power down mode entry signal.

A further aspect of the present invention is a method for controlling a semiconductor memory device provided with a normal mode, in which refreshing is periodically performed, and a power down mode, in which refreshing is stopped. The semiconductor memory device includes a refresh control circuit for performing an oscillation operation and generating a refresh request signal. The method comprising the steps of shifting the mode from the normal mode to the power down mode, stopping the generation of the refresh request signal by stopping the oscillation operation of the refresh control circuit during the power down mode, returning the mode from the power down mode to the normal mode, and generating the refresh request signal by starting the oscillation operation of the refresh control circuit during the normal mode.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
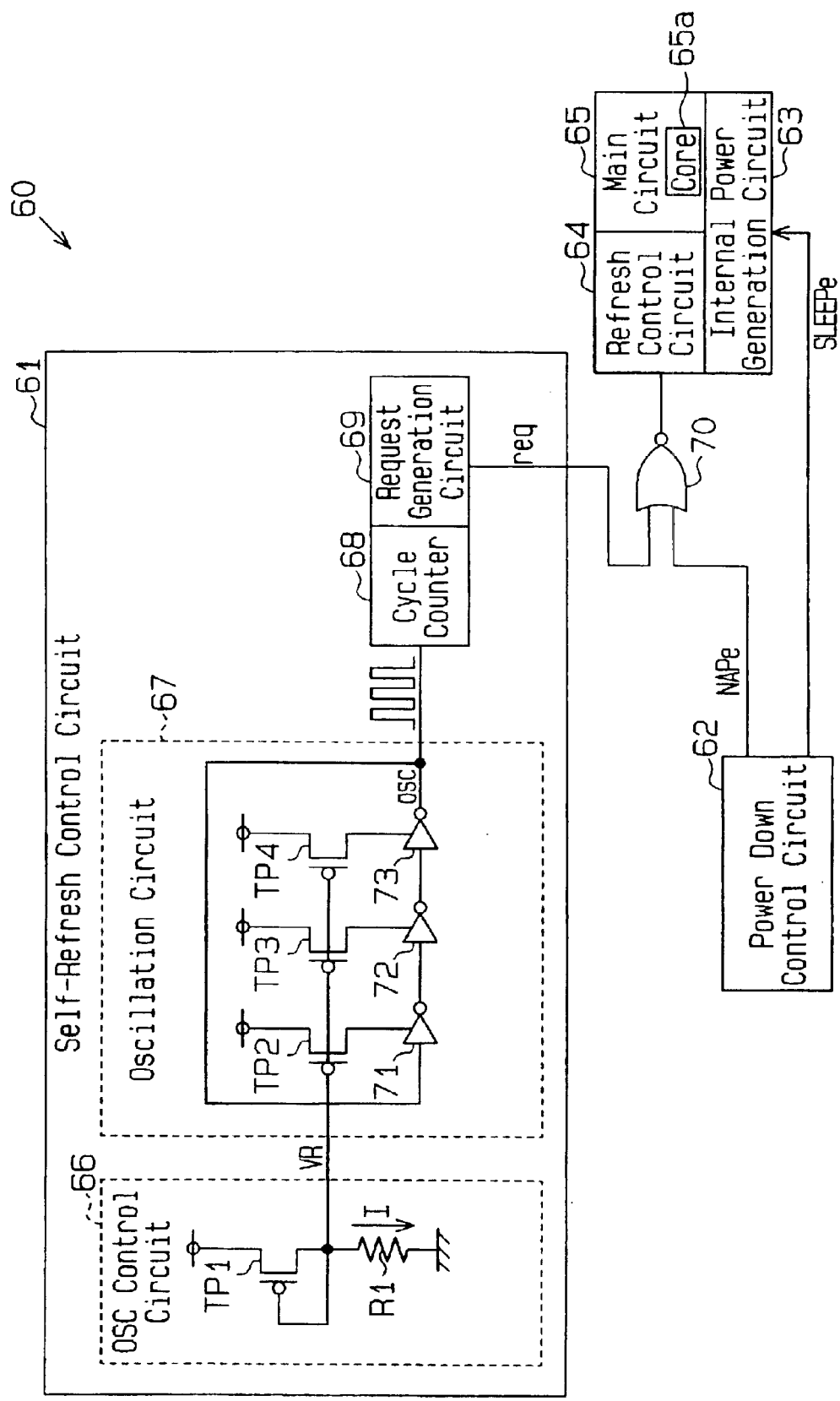
FIG. 1 is a schematic block diagram of a prior art DRAM.
Figure 2:
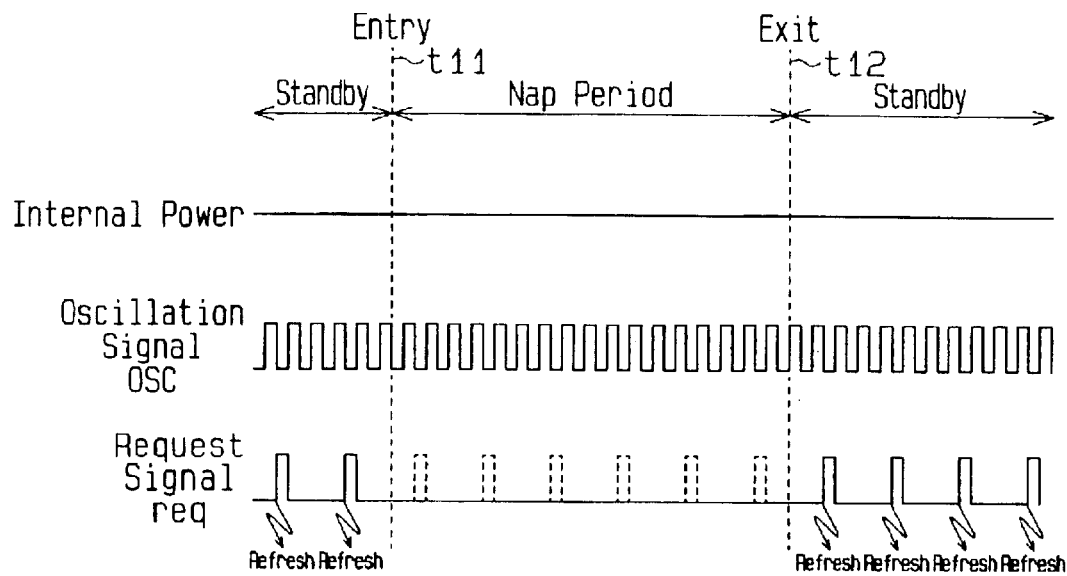
FIG. 2 is a waveform chart illustrating the operation of the DRAM of FIG. 1.
Figure 3:
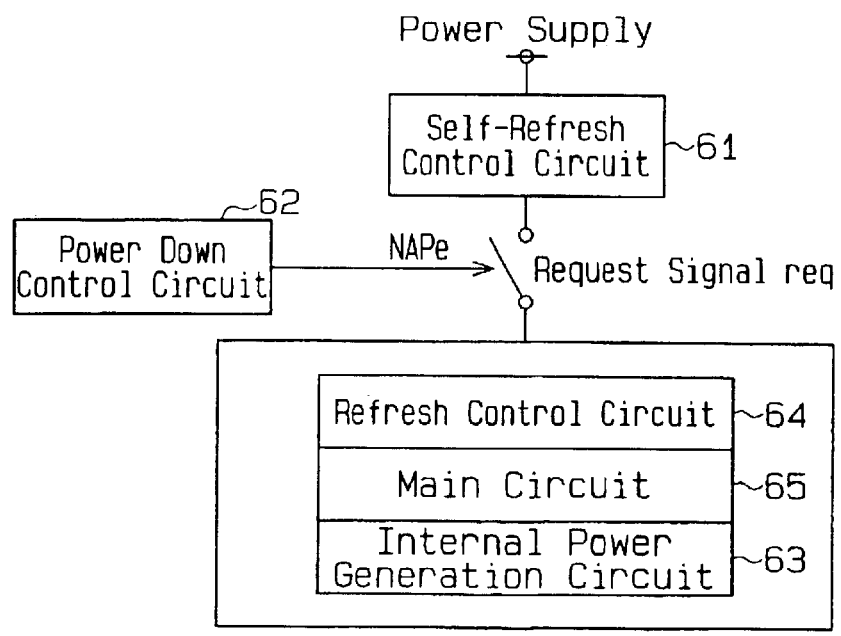
FIG. 3 is a diagram illustrating a nap mode of the DRAM of FIG. 1.
Figure 4:
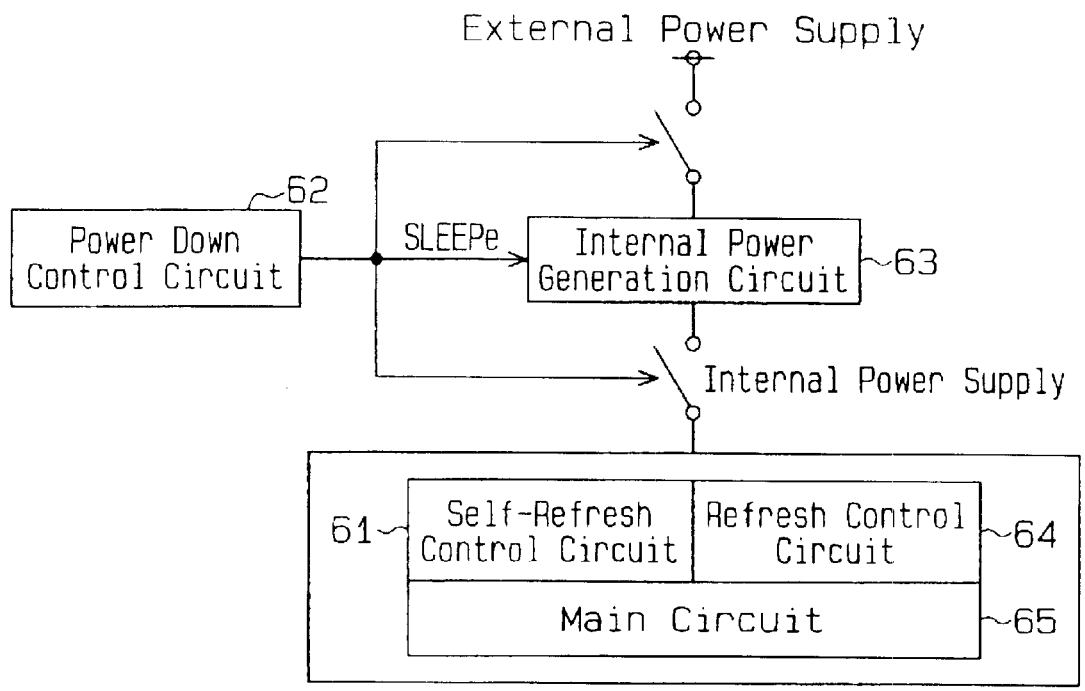
FIG. 4 is a diagram illustrating a sleep mode of the DRAM of FIG. 1.
Figure 5:
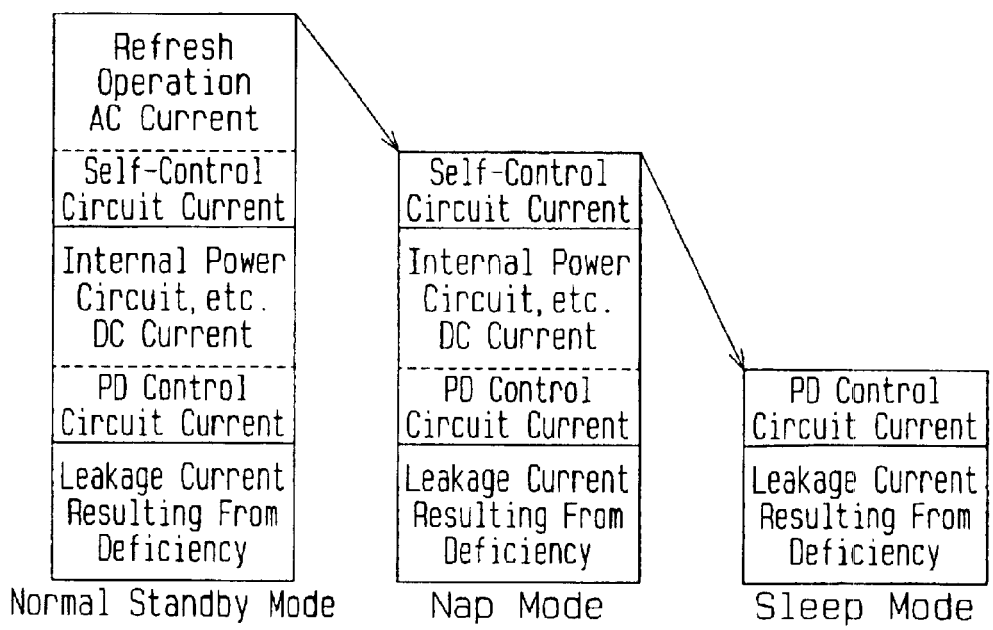
FIG. 5 is a chart illustrating current consumption in each mode of the DRAM of FIG. 1.
Figure 6A:
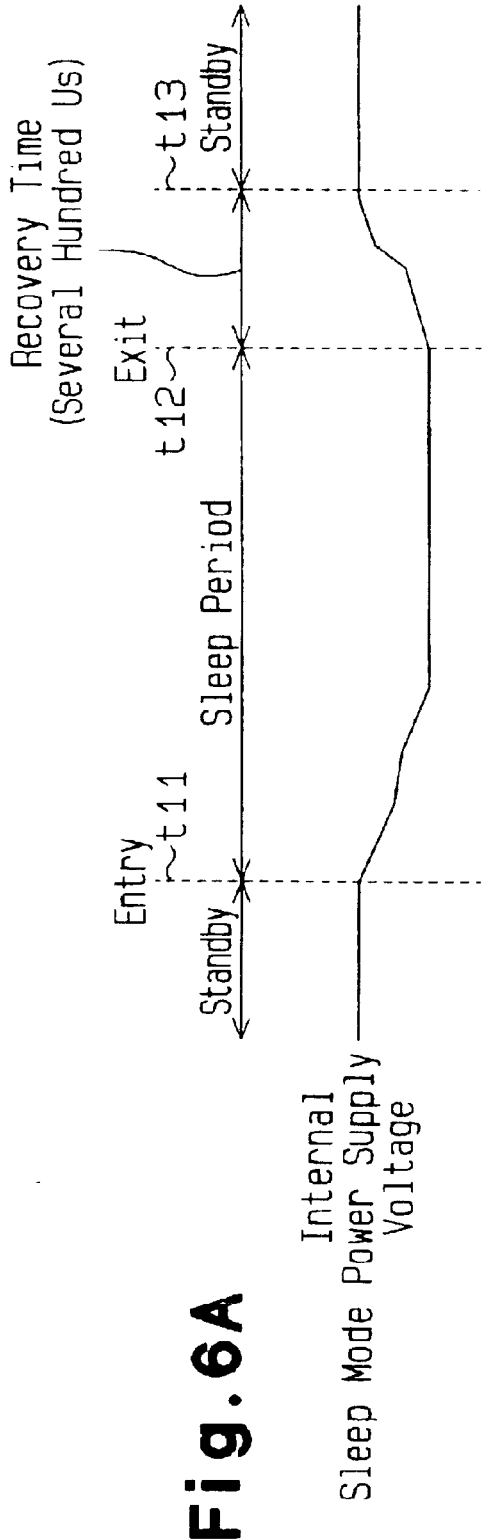
FIG. 6A is a chart illustrating the recovery time from the sleep mode to a standby mode.
Figure 6B:
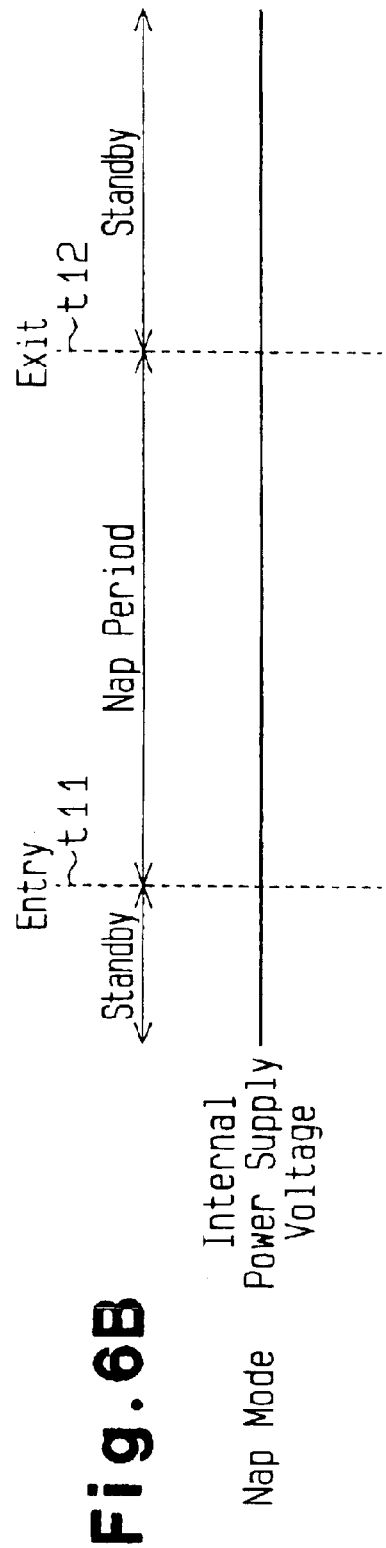
FIG. 6B is a chart illustrating the recovery time from the nap mode to the standby mode.

In the drawings, like numerals are used for like elements throughout.

Figure 7:
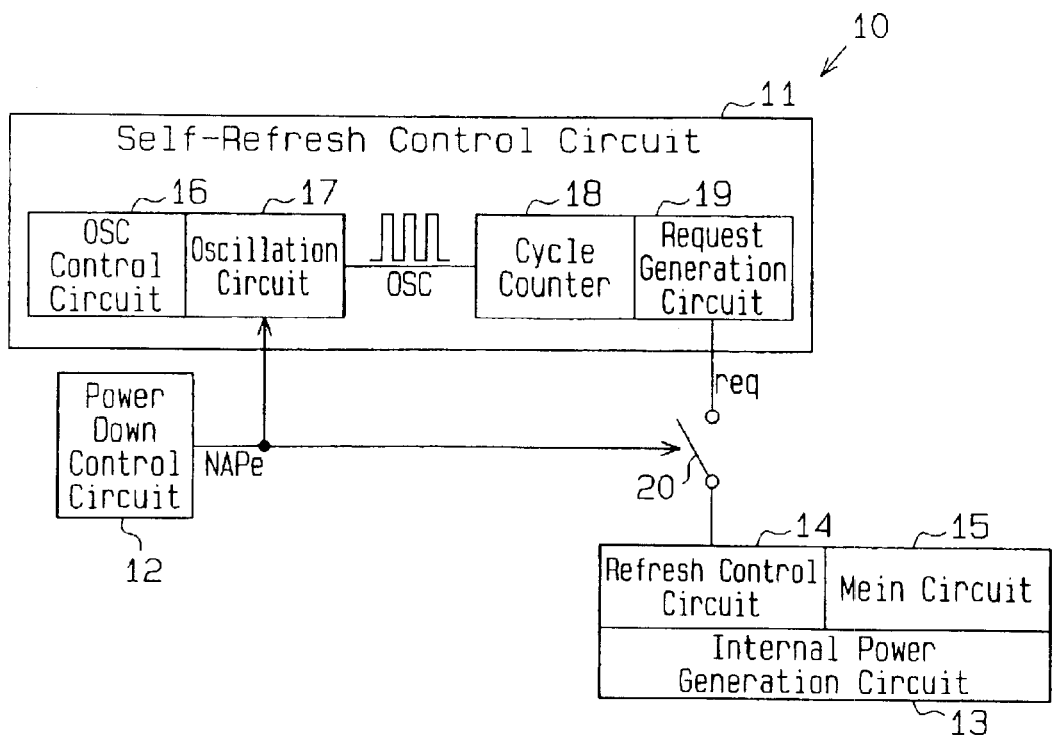
FIG. 7 is a schematic block diagram of a DRAM according to a first embodiment of the present invention.

With reference to FIG. 7, a DRAM 10 according to a first embodiment of the present invention includes a self-refresh control circuit 11, a power down control circuit 12, an internal power generation circuit 13, a refresh control circuit 14, and a main circuit 15. The self-refresh control circuit 11 includes an OSC control circuit 16, an oscillation circuit 17, a cycle counter 18, and a request generation circuit 19. The OSC control circuit 16 controls the frequency of an oscillation signal OSC, which is generated by the oscillation circuit 17. The cycle counter 18 counts the oscillation signal OSC. The request generation circuit 19 generates a request signal req for performing a refresh operation at predetermined cycles in accordance with the count value of the cycle counter 18.

Figure 8:
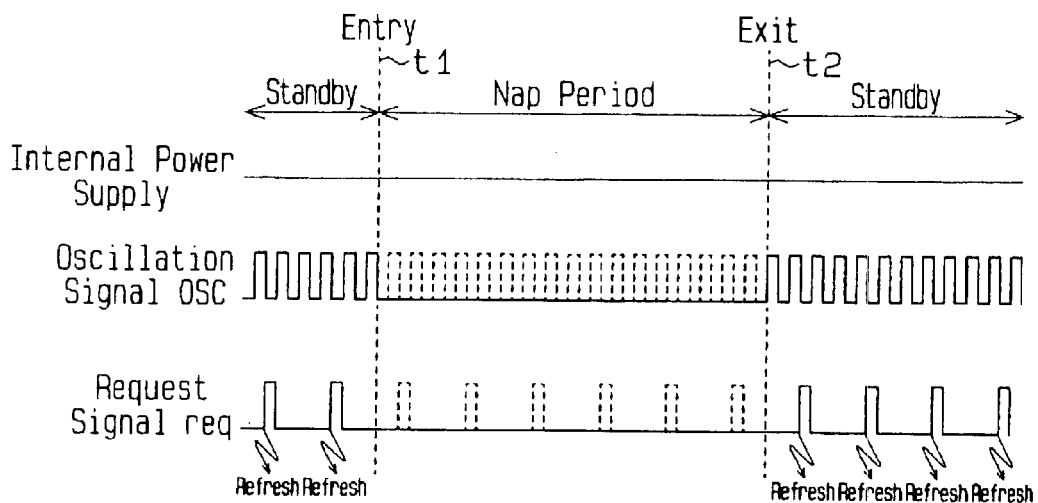
FIG. 8 is a waveform chart illustrating the DRAM of FIG. 7.

The request signal req of the self-refresh control circuit 11 is provided to the refresh control circuit 14 via a switch circuit 20. The power down control circuit 12 provides a nap mode entry signal NAPe to the switch circuit 20 and the oscillation circuit 17. Referring to FIG. 8, when the oscillation circuit 17 is provided with the entry signal NAPe during a nap period, which is between time t1 and time t2, the oscillation circuit 17 stops generating the oscillation signal OSC and reduces current consumption. During the nap period, the switch circuit 20 is inactivated, the request signal req is not provided, and the refresh operation of memory cells is stopped.

Figure 9:
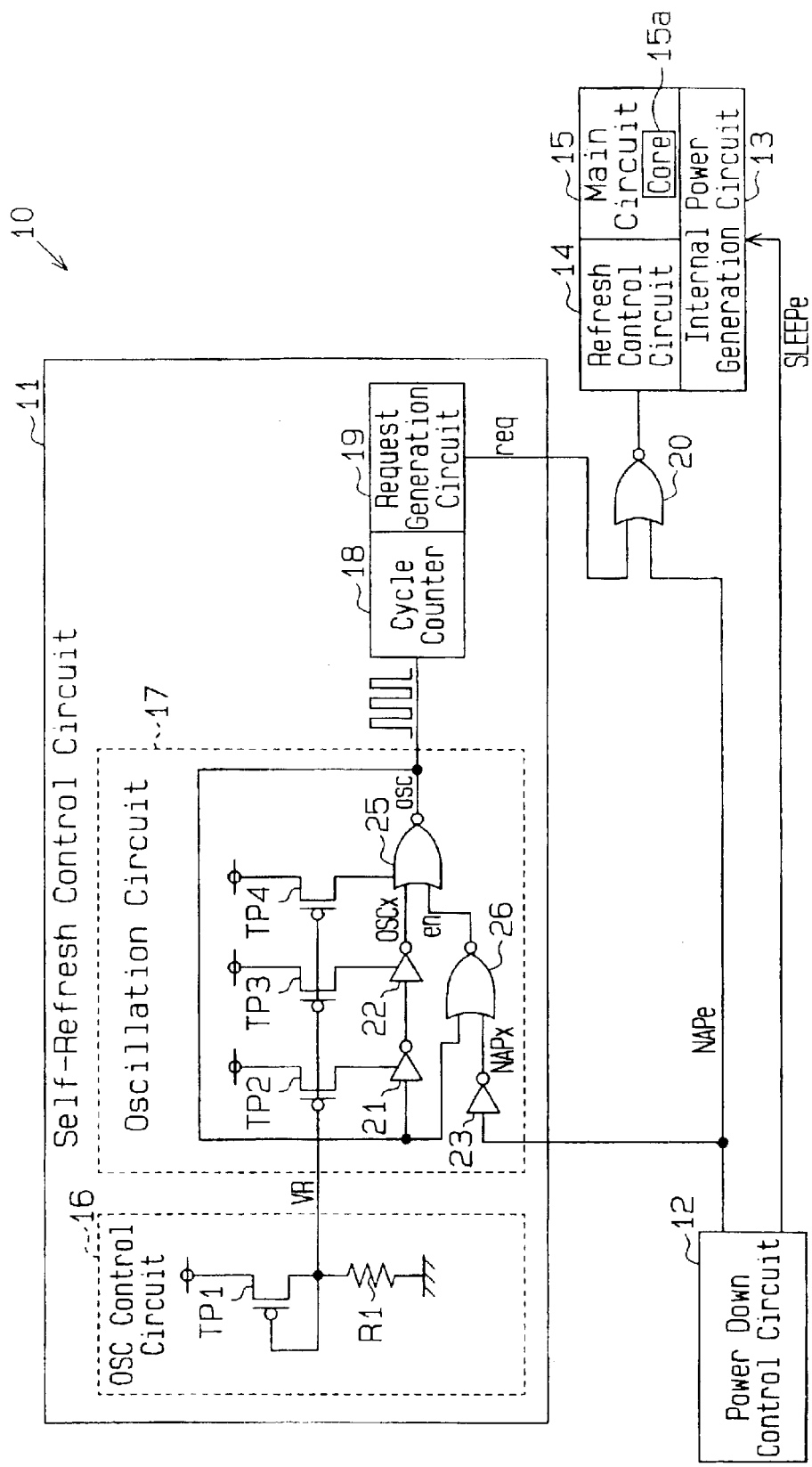
FIG. 9 is a schematic block diagram of the DRAM of FIG. 7.

FIG. 9 illustrates the DRAM 10 in more detail. The power down control circuit 12, the internal power generation circuit 13, the refresh control circuit 14, the main circuit 15, the OSC control circuit 16, the cycle counter 18, and the request generation circuit 19 have the same configuration as the corresponding circuits 62 to 69 of FIG. 1. In the DRAM 10 of the first embodiment, the oscillation circuit 17 of the self-refresh control circuit 11 differs from the prior art oscillation circuit 67.

The oscillation circuit 17 includes inverter circuits 21, 22, and 23 and NOR circuits 25 and 26. The inverter circuits 21 and 22 and the NOR circuit 25 are connected in a looped manner. That is, the inverter circuits 21 and 22 and the NOR circuit 25 are connected in series, and the output terminal of the NOR circuit 25 is connected to the input terminal of the inverter circuit 21. The power down control circuit 12 is connected to a first input terminal of the NOR circuit 26 via the inverter circuit 23. A second input terminal of the NOR circuit 26 is connected to an input terminal of the inverter circuit 21. The output terminal of the NOR circuit 26 is connected to a first input terminal of the NOR circuit 25. A second input terminal of the NOR circuit 25 is connected to an output terminal of the inverter circuit 22.

Power supply terminals of the inverter circuits 21 and 22 and the power supply terminal of the NOR circuit 25 are connected to a power supply via PMOS transistors TP2, TP3, and TP4, respectively. The OSC control circuit 16 provides an oscillation frequency control signal VR to the gate terminals of the PMOS transistors TP2, TP3, and TP4. The PMOS transistors TP2, TP3, and TP4 respectively provide the inverter circuit 21, 22 and the NOR circuit 25 with control current that is in accordance with the control signal VR.

Figure 10:
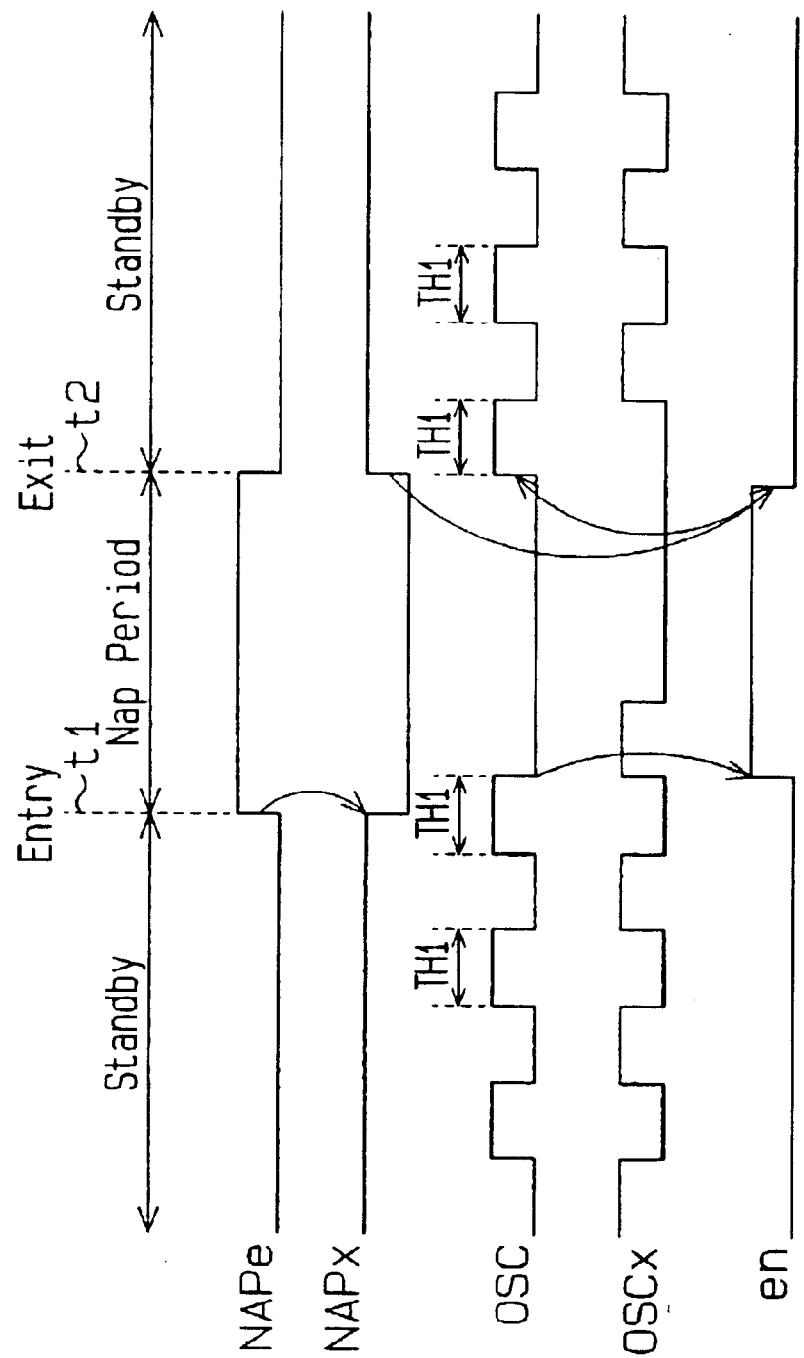
FIG. 10 is a waveform chart illustrating the operation of an oscillation circuit in the DRAM of FIG. 9.

FIG. 10 illustrates the entry signal NAPe of the power down control circuit 12, an output signal NAPx of the inverter circuit 23, an oscillation signal OSC, an output signal OSCx of the inverter circuit 22, and an output signal en of the NOR circuit 26. In the normal standby mode, the entry signal NAPe is low (i.e., the entry signal NAPe is invalidated), and the output signal NAPx of the inverter circuit 23 is high. In this state, the NOR circuit 26 generates the output signal en at a low level. Accordingly, the NOR circuit 26 functions as a logic inverting circuit, and the inverter circuits 21 and 22 and the NOR circuit 25 function as a ring oscillator. As a result, the oscillation circuit 17 generates the oscillation signal OSC. The cycle of the oscillation signal OSC is determined by the oscillation frequency control signal VR from the OSC control circuit 16. More specifically, the inverter circuits 21 and 22 and the NOR circuit 25 are provided with a control current that is in accordance with the oscillation frequency control signal VR via the transistors TP2, TP3, and TP4, respectively. The control current determines the transmission delay time, which is based on the charging and discharging time of input capacitors in each stage of the ring oscillator. One cycle of the ring oscillator is added to each transmission delay time to determine the cycle of the oscillation signal OSC.

When the nap mode is entered at time t1, the power down control circuit 12 provides the inverter circuit 23 with the entry signal NAPe at a high level (i.e., the entry signal NAPe is validated), and the inverter circuit 23 generates the output signal NAPx at a low level. In this state, the entry signal NAPe provided to the NOR circuit 20 goes high, and the NOR circuit 20 stops providing the refresh control circuit 14 with the request signal req. When the output signal NAPx of the inverter circuit 23 goes low and then the oscillation signal OSC goes low, the output signal en of the NOR circuit 26 goes high and stops the oscillation operation of the oscillation circuit 17. Whenever the output signal NAPX goes low, the ring oscillator functions to hold the oscillation signal OSC at a high level until a predetermined time TH1, which is in accordance with the pulse width of the oscillation signal OSC, elapses. When the oscillation signal OSC goes low after the predetermined time TH1 elapses, the output signal en goes high. Accordingly, when the oscillation circuit 17 stops the oscillation operation as the mode shifts from the normal standby mode to the nap mode, the generation of the oscillation signal OSC having an abnormal pulse width is prevented.

When the entry signal NAPe provided to the inverter circuit 23 goes low at time t2 to end the nap mode, the inverter circuit 23 causes the output signal NAPX to go high, and the NOR circuit 26 causes the output signal en to go low. This permits the oscillation operation of the oscillation circuit 17. That is, the output signal en goes low and the oscillation signal OSC goes high synchronously with the entry signal NAPe. In this case, the oscillation signal OSC is held at a high level for the predetermined time TH1. Accordingly, when the mode returns from the nap mode to the normal standby mode, the generation of the oscillation signal OSC having an abnormal pulse width is prevented.

As described above, the oscillation operation of the oscillation circuit 17 is accurately stopped in the nap mode. Further, in the normal standby mode, the cycle counter 18 accurately performs the count operation in accordance with the oscillation signal OSC so that the request generation circuit 19 generates the request signal req in each predetermined refresh cycle. In response to the request signal req, the refresh control circuit 14 performs a control for the self-refresh operation and refresh the memory cells of a DRAM core 15a in the main circuit 15.

Figure 11:
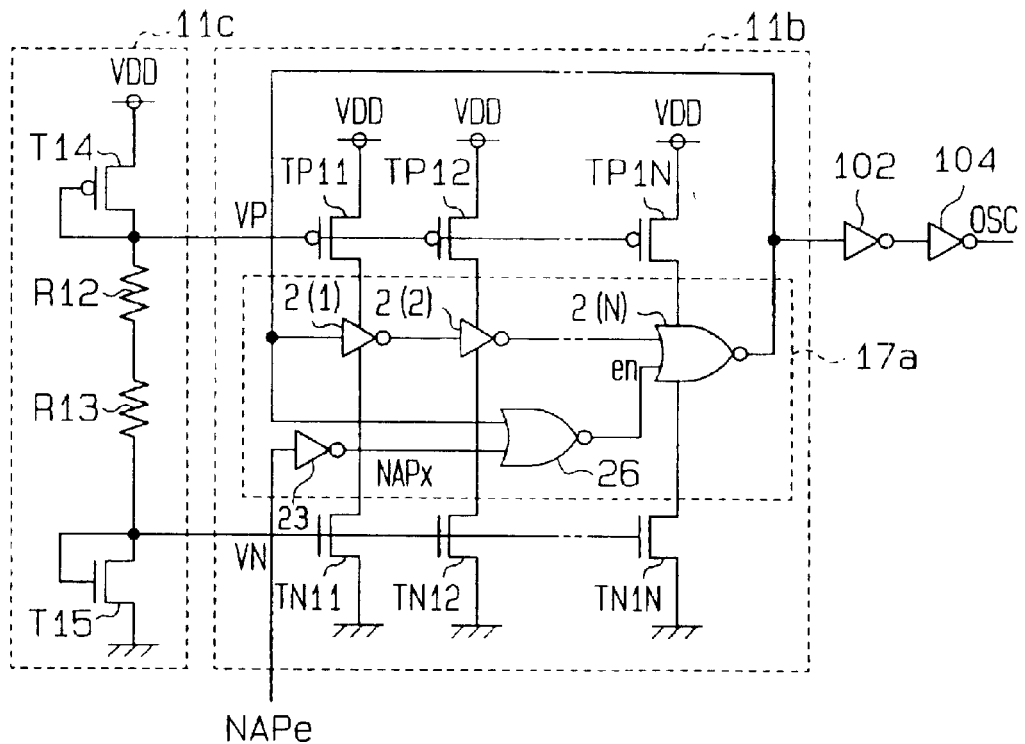
FIG. 11 is circuit diagram of an OSC control circuit and an oscillation circuit incorporated in a DRAM according to a further embodiment of the present invention.
Figure 12:
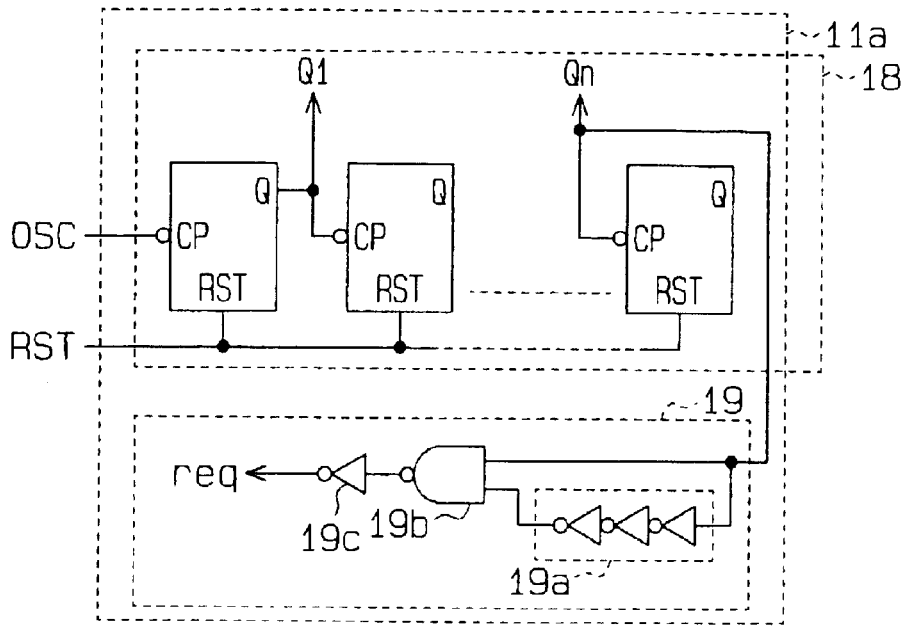
FIG. 12 is a circuit diagram of a cycle counter and a request generation circuit incorporated in the DRAM of FIG. 9.

Referring to FIG. 11, the OSC control circuit 16 may be replaced by an oscillator current restriction circuit 11c, and the oscillation circuit 17 may be replaced by an oscillator unit 11b. FIG. 12 illustrates an example of the cycle counter 18 and the request generation circuit 19.

The oscillator unit 11b, which includes an oscillation circuit 17a, generates the oscillation signal OSC. The oscillator current restriction circuit 11c controls the drive current that is supplied to the oscillation circuit 17a. The cycle counter 18 and the request generation circuit 19 function as a counter unit 11a that generates the request signal (refresh pulse) req for a predetermined time in accordance with the oscillation signal OSC, which is provided from the oscillator unit 11b. It is preferred that a standard asynchronous counter be used as the counter 18 of the counter unit 11a. However, a synchronous counter circuit or analog timer may be used in lieu of the asynchronous cycle counter 18.

Two stages of inverter circuits 102, 104 perform processing, such as waveform shaping and adjustment of driving capability, on the output signal of the oscillation circuit 17a to generate the oscillation signal OSC, which is provided to the cycle counter 18. The cycle counter 18 counts the oscillation signal OSC. When the cycle counter 18 counts the oscillation signal OSC for a 2(N−1) number of times, the cycle counter 18 provides an output signal Qn to the request generation circuit (pulse generation circuit) 19. A reset signal RST resets the cycle counter 18. The output signal Qn is directly provided to a first input terminal of a NAND circuit 19b and inverted by a delay device 19a, which includes multiple stages of inverters. The inverted signal is provided to a second input terminal of the NAND circuit 19b. When the count value reaches a predetermined number, the cycle counter 18 generates the output signal Qn at a high level. This generates a negative pulse signal that is in accordance with the delay time of the delay device 19a. The inverter circuit 19c inverts the negative pulse signal to generate a positive refresh pulse signal req. A NOR circuit may be used in lieu of the NAND circuit 19b.

The oscillation circuit 17a includes an odd number (N) of inverter circuits 2(n) (n≦N). A NOR circuit having an inverter function and the same configuration as the NOR circuit 25 of FIG. 9 is used as the final stage inverter 2 (N). The output terminal of the final inverter circuit 2 (N) is connected to the input terminal of the first inverter circuit 2(1). The inverter (NOR) circuit 2(n) has a first input terminal connected to the output terminal of the inverter 2(n−1) and a second input terminal provided with the output signal en of the NOR circuit 26.

The power supply terminals of the odd number of inverters 2(n) are connected to the drains of an odd number (N) of PMOS transistors TP1n (n<N), respectively. The source of each PMOS transistor TP1n is connected to a power supply voltage VDD. Further, the ground terminals of the odd number of inverters 2(n) are connected to the drains of an odd number (N) of NMOS transistors TN1n, respectively. The source of each NMOS transistor TN1n is connected to a ground potential.

The gates of the PMOS transistors TP1n function as nodes VP, which are connected to each other. The nodes VP are connected to a node between the drain of a PMOS transistor T14 and a resistor R12 in the oscillator current restriction circuit 11c and to the gate of the PMOS transistor T14. The source of the PMOS transistor T14 is connected to the power supply voltage VDD. The PMOS transistors TP1n and T14 configure a current mirror circuit.

The gates of the NMOS transistors TN1n are connected to each other as nodes VN. The nodes VN are connected to a node between the drain of an NMOS transistor T15 and a resistor R13 in the oscillator current restriction circuit 11c and to the gate of the NMOS transistor T15. The source of the NMOS transistor T15 is connected to the ground potential. The NMOS transistors TN1n and T15 configure a current mirror circuit.

The DRAM 10 of the first embodiment has the advantages described below.

(1) The power down control circuit 12 generates and provides the nap mode entry signal NAPe to the oscillation circuit 17 of the self-refresh control circuit 11. In response to the entry signal NAPe, the oscillation circuit 17 stops the oscillation operation. This reduces current consumption that would result from the oscillation operation of the oscillation circuit 17.

(2) The generation of the oscillation signal OSC with an abnormal pulse width is prevented when the mode shifts from the normal standby mode to the nap mode and from the nap mode to the normal standby mode. This guarantees that the refresh operation is performed.

Figure 13:
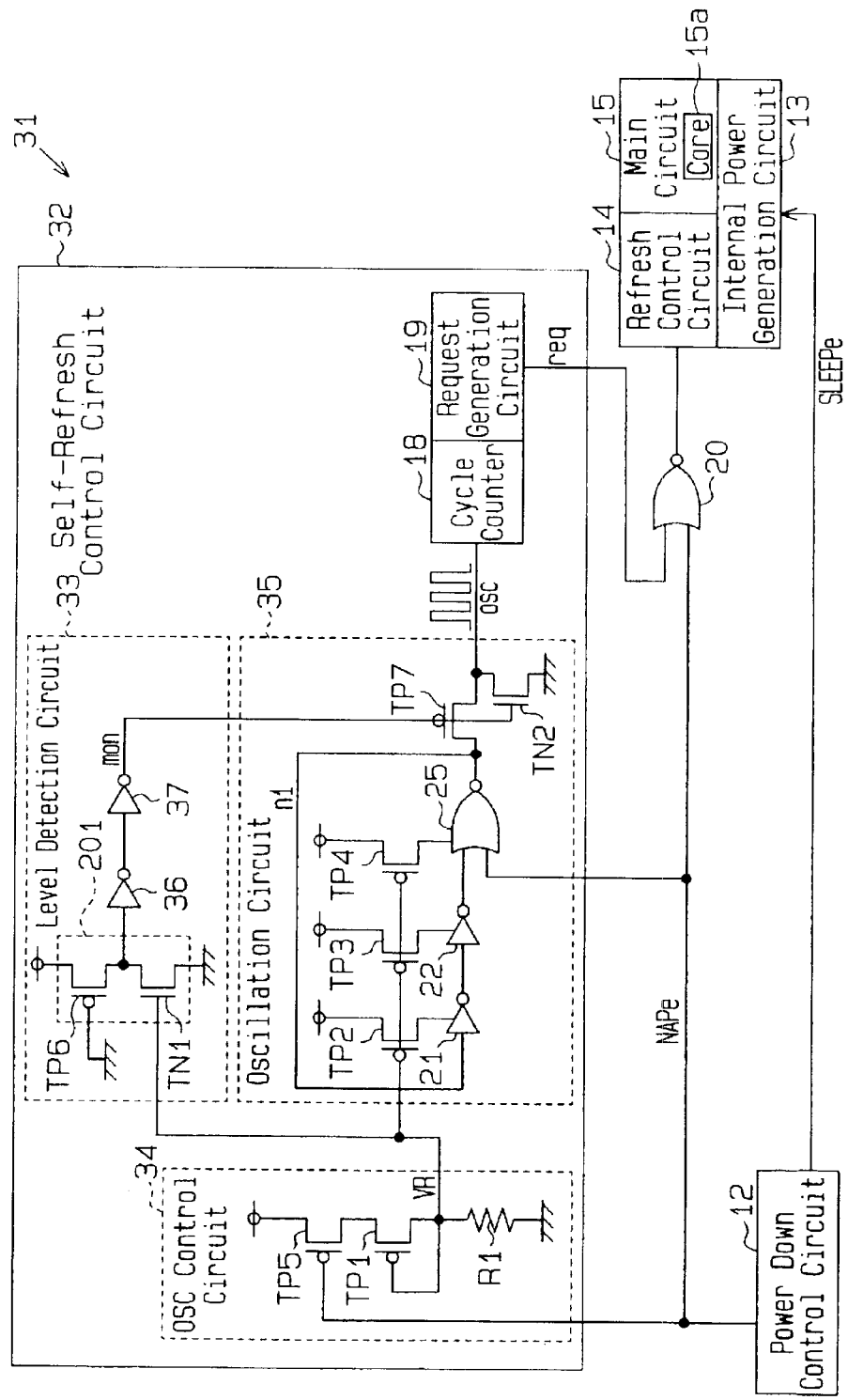
FIG. 13 is a schematic block diagram of a DRAM according to a second embodiment of the present invention.

A DRAM 31 according to a second embodiment of the present invention will now be discussed with reference to FIGS. 13 and 14. The DRAM 31 includes a self-refresh control circuit 32. The self-refresh control circuit 32 includes a cycle counter 18, a request generation circuit 19, a level detection circuit 33, an OSC control circuit 34, and an oscillation circuit 35.

The OSC control circuit 34 includes a PMOS transistor TP5, a PMOS transistor TP1, and a resistor R1, which are connected in series between a power supply and the ground. The gate terminal of the PMOS transistor TP1 is provided with the entry signal NAPe of the power down control circuit 12. The PMOS transistor TP1, the gate and drain terminals of which are connected to each other, generate an oscillation frequency control signal VR at its drain terminal.

The level detection circuit 33, which includes inverter circuits 36 and 37, a PMOS transistor TP6, and an NMOS transistor TN1, detects whether the oscillation frequency control signal VR has reached a predetermined voltage. When the oscillation frequency control signal VR reaches the predetermined voltage, the level detection circuit 33 activates a detection signal mon.

The PMOS transistor TP6 and the NMOS transistor TN1 are connected in series between the power supply and the ground. The gate terminal of the NMOS transistor TN1 is provided with the oscillation frequency control signal VR. The gate terminal of the PMOS transistor TP6 is connected to the ground. The PMOS transistor TP6 and the NMOS transistor TN1 configure a logic inverting circuit 201. A node between the PMOS transistor TP6 and the NMOS transistor TN1 is the output terminal of the logic inverting circuit. The signal generated at the output terminal of the logic inverting circuit is provided to the oscillation circuit 35 via the two series-connected inverter circuits 36 and 37.

The threshold voltage of the logic inverting circuit 201 is set in accordance with the balance between the conductance of the PMOS transistor TP6 and the conductance of the NMOS transistor TN1. More specifically, the oscillation circuit 35 sets the threshold voltage so that the logic inverting circuit 201 performs a logic inverting operation in response to the voltage of the oscillation frequency control signal VR, which is used to have the oscillation circuit 35 perform the oscillation operation at a predetermined frequency. That is, when the OSC control circuit 34 is powered, the oscillation frequency control signal VR increases from the ground voltage to a predetermined voltage according to the predetermined frequency. Thus, the threshold voltage is set in accordance with the predetermined voltage. This guarantees that the logic inverting operation is performed and the detection signal mon becomes active when the voltage of the oscillation frequency control signal VR reaches the predetermined voltage. The two inverter circuits 36 and 37 perform processing, such as waveform shaping, the obtaining of the drive capability, and the matching of logics, on the output signal of the logic inverting circuit 201.

The oscillation circuit 35 includes two inverter circuits 21 and 22, a NOR circuit 25, four PMOS transistors TP2, TP3, TP4, and TP7, and an NMOS transistor TN2. The two inverter circuits 21 and 22 and the NOR circuit 25 are connected in a looped manner. The power supply terminals of the inverter circuits 21 and 22 and the power supply terminal of the NOR circuit 25 is connected to the power supply via PMOS transistors TP2, TP3, TP4, respectively. The gate terminals of the PMOS transistors TP2, TP3, and TP4 are provided with the oscillation frequency control signal VR. The transistors TP2, TP3, and TP4 respectively supply the inverter circuits 21 and 22 and the NOR circuit 25 with a control current that is in accordance with the control signal VR.

The power down control circuit 12 provides the entry signal NAPe to the NOR circuit 25 to control the oscillation operation of the oscillation circuit 35. In the first embodiment, the output signal en of the NOR circuit 26 is used as the control signal of the oscillation operation. In the second embodiment, the entry signal NAPe is used as the control signal of the oscillation operation. More specifically, when the entry signal NAPe goes high in the nap mode, the output signal of the NOR circuit 25 goes low and stops the oscillation operation of the oscillation circuit 35. In a state in which the entry signal NAPe is low to permit oscillation, the NOR circuit 25 functions as a logic inverting circuit, and the oscillation circuit 35 performs the oscillation operation.

The NOR circuit 25 is connected to the cycle counter 18 via the PMOS transistor TP7. A node between the transistor TP7 and the cycle counter 18 is connected to the ground via the NMOS transistor TN2. The gate terminals of the PMOS transistor TP7 and the NMOS transistor TN2 are provided with the detection signal mon of the level detection circuit 33. When the detection signal mon is low, the PMOS transistor TP7 is turned on, the NMOS transistor TN2 is turned off, and the output signal of the NOR circuit 25 is provided to the cycle counter 18 via the PMOS transistor TP7 as the oscillation signal OSC. When the detection signal mon is high, the PMOS transistor TP7 is turned off, the NMOS transistor TN2 is turned on, and the oscillation signal OSC is not provided to the cycle counter 18. In the second embodiment, the PMOS transistor TP7 functions as a switch circuit for permitting and prohibiting the output of the oscillation signal OSC.

Figure 14:
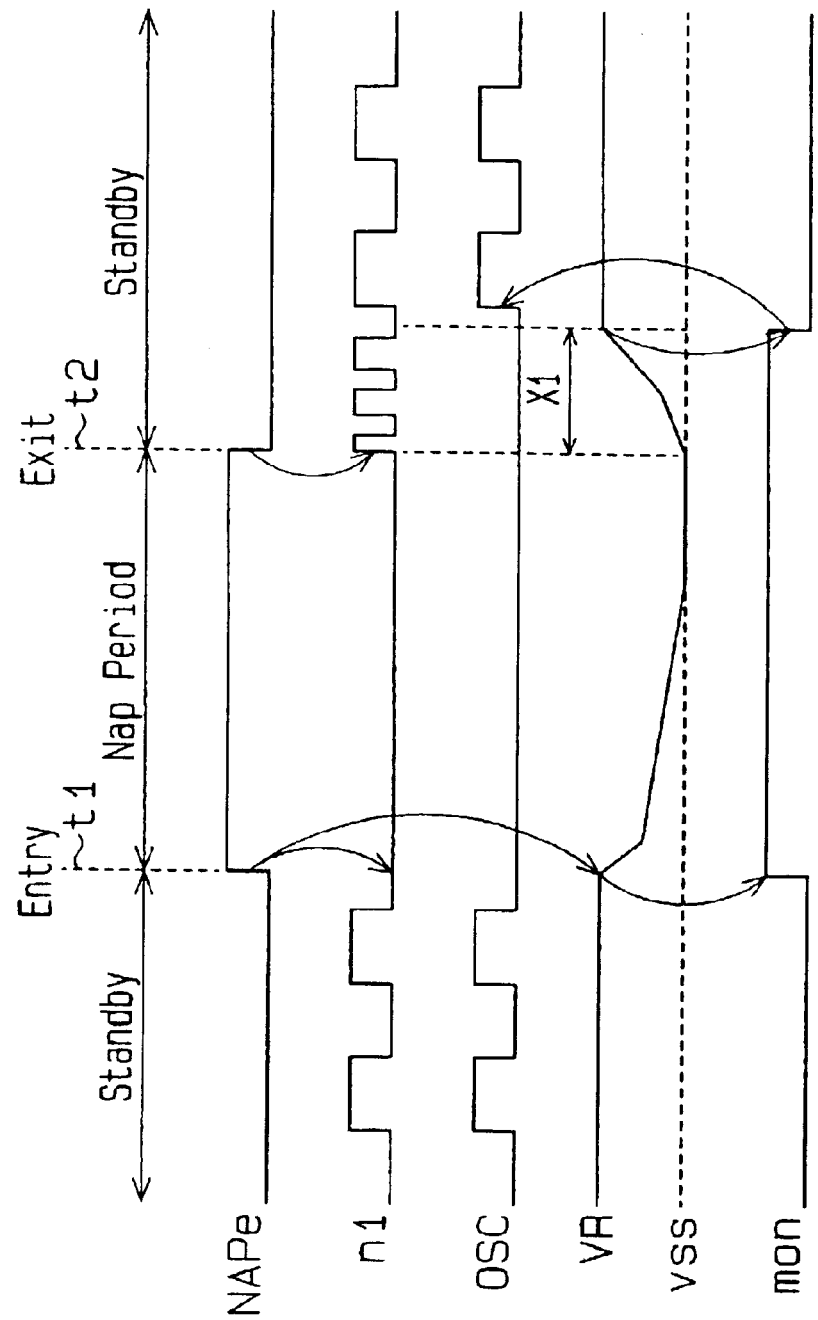
FIG. 14 is a waveform chart illustrating the operation of an oscillation circuit in the DRAM of FIG. 13.

FIG. 14 illustrates the operation of the oscillation circuit 35 with the entry signal NAPe, the output signal n1 of the NOR circuit 25, the oscillation signal OSC, the oscillation signal OSC, the oscillation frequency control signal VR, and the detection signal mon.

In the normal standby mode until time t1, the PMOS transistor TP5 is turned on when the entry signal NAPe goes low. This supplies the OSC control circuit 34 with power and generates the oscillation frequency control signal VR at the predetermined voltage. In this state, the level detection circuit 33 provides the low level detection signal mon to the PMOS transistor TP7 to cause the PMOS transistor TP7 to be turned on. The NOR circuit 25, which is provided with the low entry signal NAPe, functions as the logic inverting circuit. In this manner, the inverter circuits 21 and 22 and the NOR circuit 25 function as a ring oscillator, and the output signal n1 of the NOR circuit 25 is provided to the cycle counter 18 via the PMOS transistor TP7.

When entering the nap mode at time t1, the power down control circuit 12 provides the NOR circuit 25 with the entry signal NAPe at a high level, the NOR circuit 25 causes its output signal n1 to go low, and the oscillation circuit 35 stops the oscillation operation. The high entry signal NAPe causes the PMOS transistor TP5 of the OSC control circuit 34 to be turned off. This stops supplying power to the OSC control circuit 34 and inactivates the OSC control circuit 34. Thus, the voltage of the oscillation frequency control signal VR gradually decreases until reaching the ground voltage VSS, and the detection signal mon goes high. The PMOS transistor TP7 is thus turned off and the NMOS transistor TN2 is turned on.

When the nap mode ends at time t2, the power down control circuit 12 provides the NOR circuit 25 with the entry signal NAPe at a low level. Further, the ring oscillator, which is configured by the inverter circuits 21 and 22 and the NOR circuit 25, restarts the oscillation operation. In this state, the PMOS transistor TP5 is turned on to supply the OSC control circuit 34 with power. This gradually increases the voltage of the oscillation frequency control signal VR. Immediately after time t2 (i.e., period X1 in FIG. 14), the voltage of the oscillation frequency control signal VR is lower than the predetermined voltage and the oscillation frequency of the output signal n1 of the NOR circuit is greater than the normal oscillation frequency, which is in accordance with the refresh cycle.

The level detection circuit 33 generates the detection signal at a high level until the voltage of the oscillation frequency control signal VR reaches the predetermined voltage (i.e., the voltage that obtains the normal oscillation frequency). Accordingly, the oscillation signal OSC is prohibited from being provided to the cycle counter 18 during transitional period X1, which is when the voltage of the oscillation frequency control signal OSC increases.

The DRAM 31 of the second embodiment has the advantages described below.

(1) The oscillation circuit 35 stops the oscillation operation in response to the entry signal NAPe. When the entry signal NAPe turns off the PMOS transistor TP5, which is arranged in the power supply path, the OSC control circuit 34 stops generating the oscillation frequency control signal VR. The execution of such control reduces the current consumption of the self-refresh control circuit 32.

(2) The detection signal mon determines the timing for providing an oscillation signal at the desired frequency, which is set by the oscillation frequency control signal VR. That is, the timing for providing the oscillation signal is determined so that the oscillation circuit 35 does not generate an instable oscillation signal during the transitional period X1, in which the voltage of the oscillation frequency control signal VR is instable.

(3) The PMOS transistor TP7, which responds to the detection signal mon of the level detection circuit 33, is arranged between the oscillation circuit 35 and the cycle counter 18. The PMOS transistor TP7 stops generating the oscillation signal OSC with a cycle differing from the predetermined oscillation cycle, which is in accordance with the refresh operation.

A DRAM 41 according to a third embodiment of the present invention will now be discussed with reference to FIGS. 15 and 16.

Figure 15:
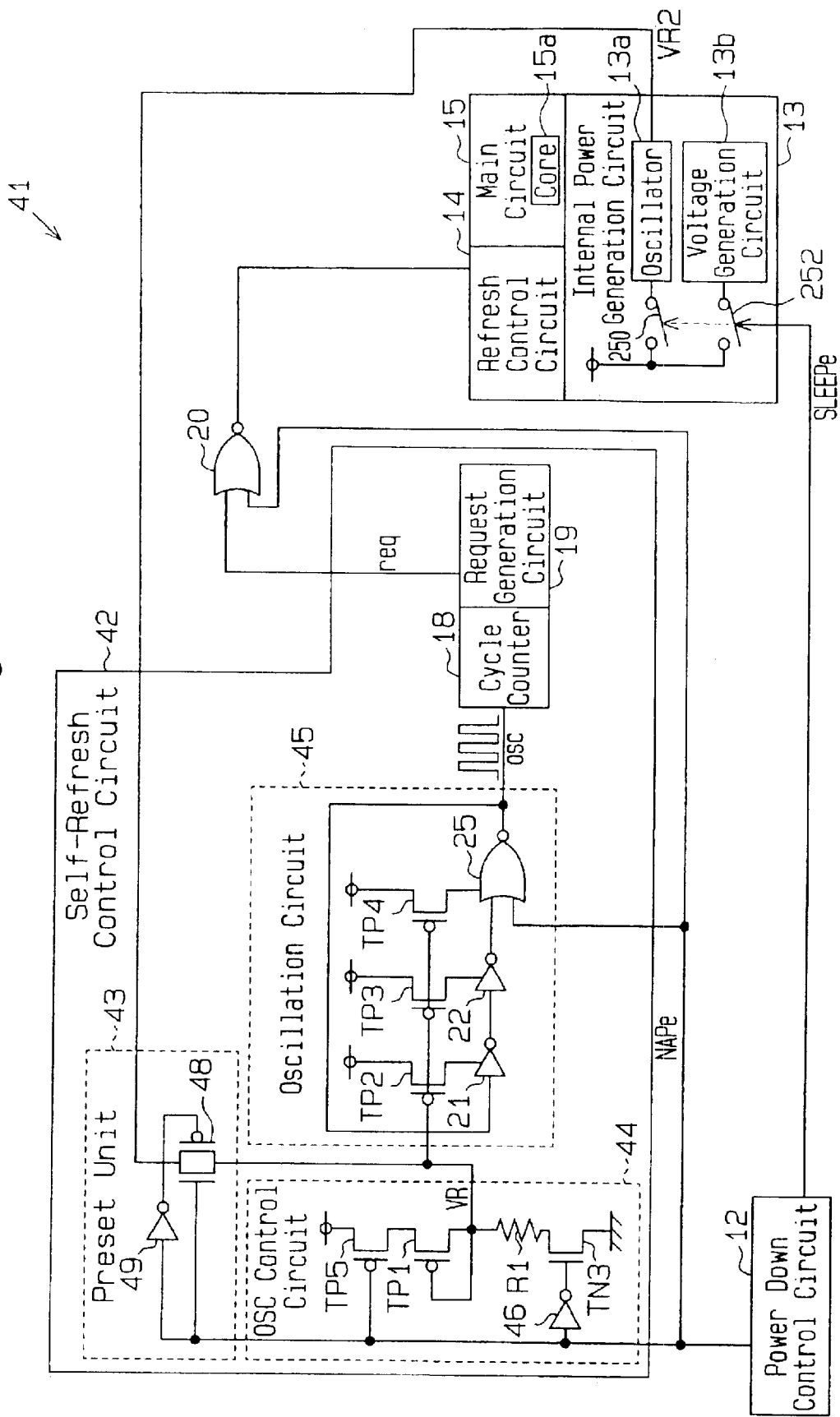
FIG. 15 is a schematic block diagram of a DRAM according to a third embodiment of the present invention.

Referring to FIG. 15, the self-refresh control circuit 42 of the DRAM 41 includes a cycle counter 18, a request generation circuit 19, a preset unit 43, an OSC control circuit 44, and an oscillation circuit 45.

The OSC control circuit 44 includes a PMOS transistor TP5, a PMOS transistor TP1, a resistor R1, and an NMOS transistor TN3, which are connected in series between the power supply and the ground. The gate terminal of the PMOS transistor TP5 is provided with the entry signal NAPe of the power down control circuit 12. The inverter circuit 46 inverts the entry signal NAPe and provides the inverted entry signal NAPe to the gate terminal of the NMOS transistor TN3.

The oscillation circuit 45 includes two inverter circuits 21 and 22 and a NOR circuit 25, which are connected in a looped manner. The power supply terminals of the inverter circuits 21 and 22 and the power supply terminal of the NOR circuit 25 are connected to the power supply via PMOS transistors TP2, TP3, and TP4, respectively. The gate terminals of the PMOS transistors TP2, TP3, and TP4 are provided with the oscillation frequency control signal VR. The transistors TP2, TP3, and TP4 respectively provide the inverter circuits 21 and 22 and the NOR circuit 25 with control current in accordance with the control signal VR.

The entry signal NAPe of the power down control circuit 12 is provided to the NOR circuit 25, and the NOR circuit 25 controls the oscillation operation of the oscillation circuit 45 in accordance with the entry signal NAPe. When the entry signal NAPe goes high during the nap mode, the NOR circuit 25 causes its output signal to go low. This stops the oscillation operation of the oscillation circuit 45. In a state in which the entry signal NAPe is low and oscillation is permitted, the NOR circuit 25 functions as a logic inverting circuit, which is part of a ring oscillator, and the oscillation circuit 45 performs the oscillation operation.

The preset unit 43 includes a transfer gate 48 and an inverter circuit 49. The transfer gate 48 has a PMOS transistor and an NMOS transistor, the source terminals of which are connected to each other and the drain terminals of which are connected to each other. The inverter circuit 49 is connected between the gate terminal of the NMOS transistor and the gate terminal of the PMOS transistor. In the transfer gate 48, the power down control circuit 12 provides the gate terminal of the NMOS transistor with the entry signal NAPe.

Further, the inverter circuit 49 inverts the entry signal NAPe and provides the PMOS transistor with the inverted entry signal NAPe. The transfer gate 48 is turned on when the entry signal NAPe goes high and turned off when the entry signal NAPe goes low.

The preset unit 43 is connected between the internal power generation circuit 13 and a node between the OSC control circuit 44 and the oscillation circuit 45. When the transfer gate 48 is turned on, a control signal VR2, which is generated by the internal power generation circuit 13, is transmitted to an output node of the OSC control circuit 44. When the transfer gate 48 is turned off, the transmission of the control signal VR2 is stopped.

The internal power generation circuit 13 includes an oscillator 13a and a voltage generation circuit 13b. The voltage generation circuit 13b generates power supply voltage, which includes a negative voltage and a boosted voltage, in accordance with the oscillation signal of the oscillator 13a. The oscillator 13a, which preferably is a current control oscillator, includes an OSC control circuit, which generates the control signal VR2, and an oscillation circuit, which generates an oscillation signal in accordance with the control signal VR2. The oscillator 13a, which remains activated in the nap mode, generates the control signal VR2 and provides the voltage generation circuit 13b with the oscillation signal that is in accordance with the control signal VR2. The control signal VR2, which is generated by the oscillator 13a, is provided to the oscillation circuit 45 via the preset unit 43. The control signal VR2 has a voltage that is substantially equal to the voltage of the oscillation frequency control signal VR, which is generated by the OSC control circuit 44 of the self-refresh control circuit 42. In other words, the control signal VR2, the voltage of which is substantially equal to the voltage of the frequency control signal VR, is selected.

The internal power generation circuit 13, which remains activated in the nap mode, includes a voltage generation circuit 13b that generates various types of equalizing voltages, such as those for the main circuit 15 or the core 15a. More specifically, the voltage generation circuit 13b generates a bit line equalizing voltage, a data bus equalizing voltage, or a determination reference potential used by a differential amplifier to determine data "1"/"0". The internal power generation circuit 13 may include a voltage generation circuit 13b for generating low voltage supplied to the core 15a, such as the voltage of the memory cell plate.

In the sleep mode of the DRAM 41, the power down control circuit 12 provides the internal power generation circuit 13 with an entry signal SLEEPe having a high level to activate the internal power generation circuit 13. That is, when the entry signal SLEEPe is provided to switch circuits 250 and 252, the switch circuits 250 and 252 are turned off. This breaks the power supply line leading to the oscillator 13a and the voltage generation circuit 13b and stops the generation of each power supply voltage.

Figure 16:
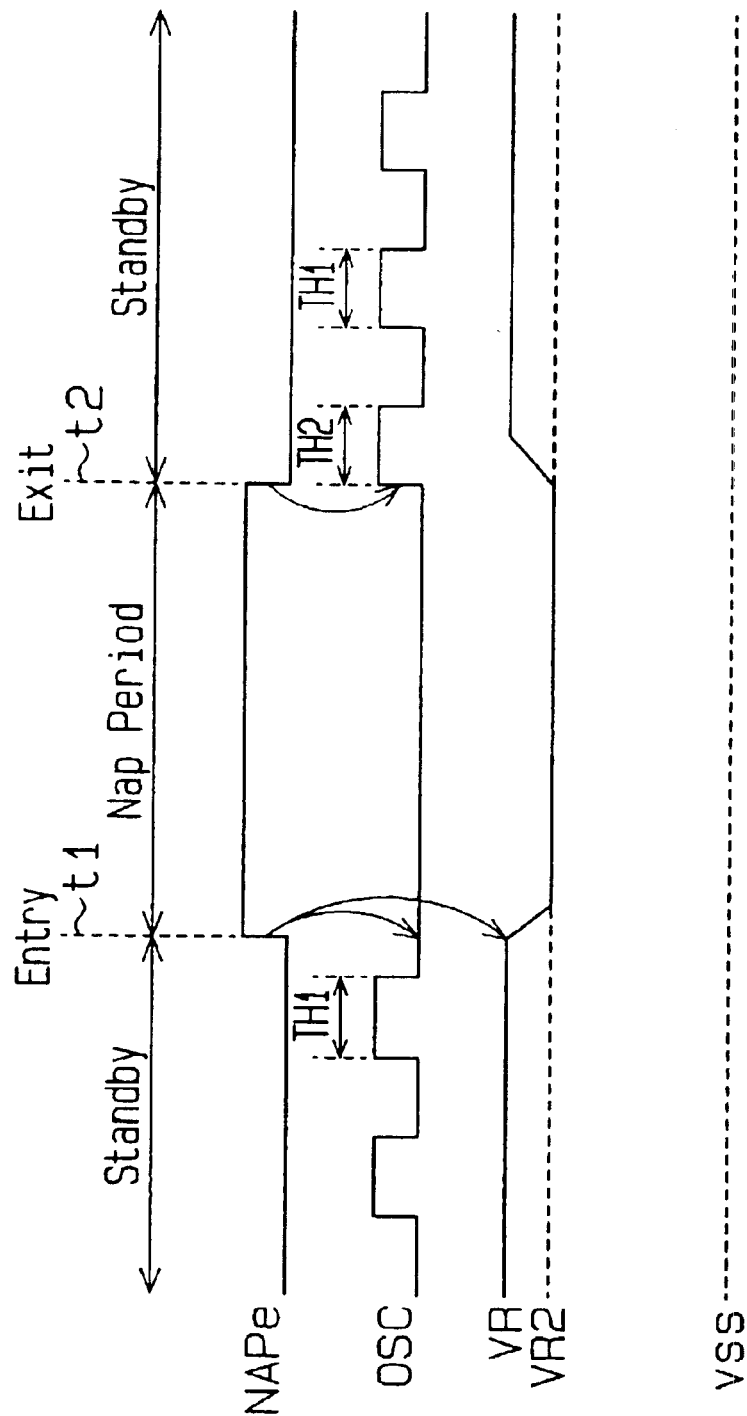
FIG. 16 is a waveform chart illustrating the operation of the DRAM of FIG. 15.

FIG. 16 illustrates the operation of the oscillation circuit 45 with the entry signal NAPe, the oscillation signal OSC, and the oscillation frequency control signal VR.

In the normal standby mode until time t1, the PMOS transistor TP5 and the NMOS transistor TN3 are turned on when the entry signal NAPe goes low. This supplies the OSC control circuit 44 with power and generates the oscillation frequency control signal VR at the predetermined voltage. In this state, the low entry signal NAPe turns off the transfer gate 48. Thus, the transfer gate 48 stops the transmission of the control signal VR2 from the internal power generation circuit 13.

When entering the nap mode at time t1, the NOR circuit 25 causes its output signal to go low when the entry signal NAPe goes high. This stops the oscillation operation of the oscillation circuit 45. The high entry signal NAPe turns off the PMOS transistor TP5 and the NMOS transistor TN3. This cuts the supply of power and stops the output of the oscillation frequency control signal VR. In this state, the transfer gate 48 is turned on in response to the high entry signal NAPe, and the control signal VR2 of the internal power generation circuit 13 is provided to the output node of the OSC control circuit 44. Accordingly, the input of the oscillation circuit 45 is maintained at the voltage of the control signal VR2 during the nap period in which the entry signal NAPe is high.

When the nap mode ends at time t2, the transfer gate 48 stops the transmission of the control signal VR2 when the entry signal NAPe goes low. This activates the OSC control circuit 44 and generates the oscillation frequency control signal VR at the predetermined voltage. In this state, the NOR circuit 25 functions as a logic inverting circuit in accordance with the low entry signal NAPe and restarts the oscillation operation of the oscillation circuit 45. The voltage of the control signal VR2 is substantially equal to the voltage of the oscillation frequency control signal VR (in FIG. 16, the control signal VR2 is slightly lower than the control signal VR). Thus, even immediately after time t2, the oscillation signal OSC is prevented from being generated with an oscillation cycle that differs from the normal oscillation cycle until the voltage of the oscillation frequency control signal VR stabilizes at the predetermined voltage. That is, the oscillation signal OSC generated immediately after time t2 has a pulse width TH2 that is substantially the same as the pulse width TH1 of the oscillation signal OSC in the normal operation mode.

The DRAM 41 of the third embodiment has the advantages described below.

(1) In response to the entry signal NAPe, the oscillation circuit 45 stops the oscillation operation, and the OSC control circuit 44 stops the output of the oscillation frequency control signal VR. This further reduces the current consumption of the self-refresh control circuit 42.

(2) In response to the entry signal NAPe, the preset unit 43 provides the control signal VR2 of the internal power generation circuit 13 to the output node of the OSC control circuit 44. That is, the control signal VR2, which has substantially the same voltage as the voltage of the oscillation frequency control signal VR of the self-refresh control circuit 42, is selected and provided to the output node of the OSC control circuit 44. The oscillation signal OSC is prevented from being generated with an oscillation cycle that differs from the normal oscillation cycle until the voltage of the oscillation frequency control signal VR reaches the predetermined voltage after returning to the normal standby mode from the nap mode.

It should be apparent to those skilled in the art that the present invention may be embodied in many other specific forms without departing from the spirit or scope of the invention. Particularly, it should be understood that the present invention may be embodied in the following forms.

Figure 17:
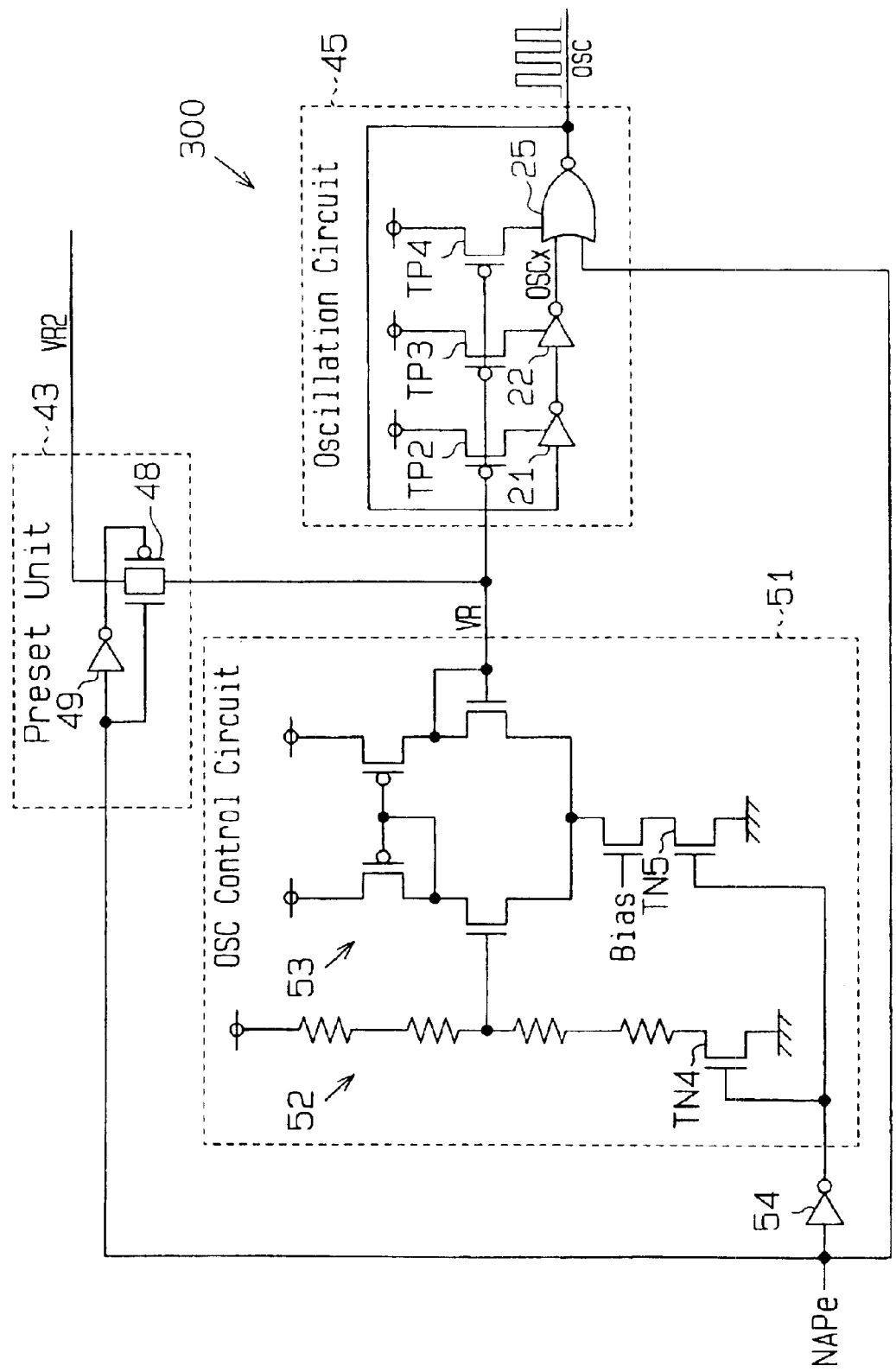
FIG. 17 is a schematic circuit diagram of a voltage control oscillation circuit.

In the first to third embodiments, a constant voltage control oscillator 300 such as that shown in FIG. 17 may be used in lieu of the constant current control oscillator that controls the drive current of the oscillation circuits 17, 35, 45 with the OSC control circuits 16, 34, 44.

The constant voltage control oscillator 300 includes an OSC control circuit 51, which controls the drive voltage of the oscillation circuit 45 and sets the oscillation frequency. The OSC control circuit 51 includes a resistor string 52 and a buffer circuit 53. The buffer circuit 53 adds voltage, which is in accordance with the drive capability, to the voltage at a predetermined position of the resistor string 52 and generates the oscillation frequency control signal VR as the drive power supply voltage. NMOS transistors TN4, TN5 are arranged in the current path between the resistor string 52 and the buffer circuit 53. An inverter circuit 54 inverts the nap mode entry signal NAPe and provides the inverted nap mode entry signal NAPe to the gate terminals of the NMOS transistors TN4, TN5. In the normal standby mode, the low entry signal NAPe turns on the NMOS transistor TN4 and connects the current path to provide the oscillation circuit 45 with the oscillation frequency control signal VR. In the nap mode, the high entry signal NAPe turns off the NMOS transistors TN4, TN5, breaks the current path, and stops supplying the oscillation circuit 45 with the drive power supply voltage from the OSC control circuit 51. In response to the high entry signal NAPe, the NOR circuit 25 causes its output signal to go low and stops the oscillation operation of the oscillation circuit 45. The voltage control oscillator 300 includes the preset unit 43 in the same manner as in the third embodiment.

Figure 18:
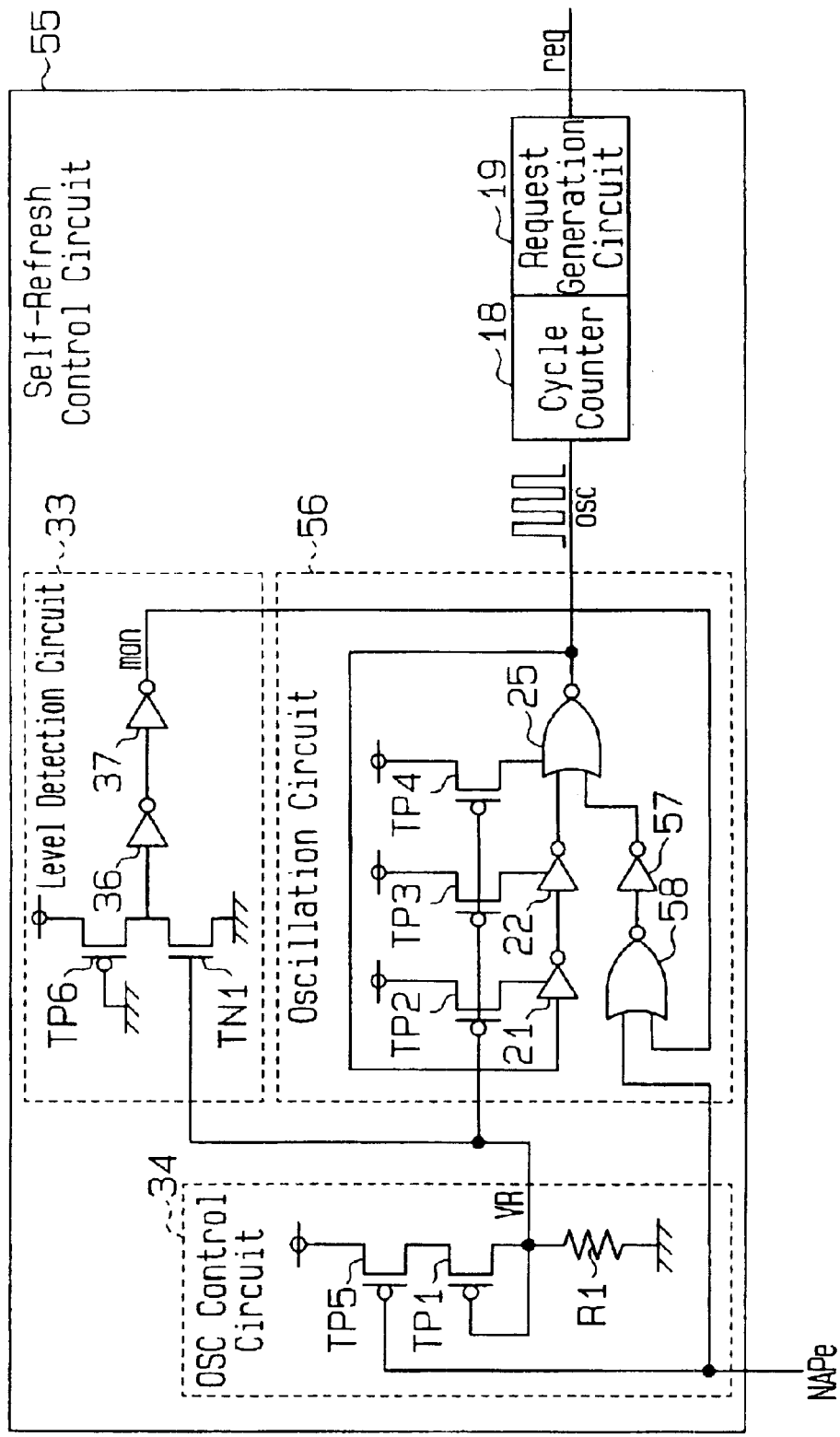
FIG. 18 is a circuit diagram of a self-refresh control circuit according to a further embodiment of the present invention.

In the second embodiment, a logic gate may be used in lieu of the PMOS transistor TP7 such as in the self-refresh control circuit 55 that is shown in FIG. 18. The self-refresh control circuit 55 includes an OSC control circuit 34, an oscillation circuit 56, a level detection circuit 33, a cycle counter 18, and a request generation circuit 19.

In addition to the inverter circuits 21 and 22 and the NOR circuit 25, the oscillation circuit 56 includes an inverter circuit 57 and a NOR circuit 58. A first input terminal of the NOR circuit 58 is provided with the entry signal NAPe, and a second input terminal of the NOR circuit 58 is provided with the detection signal mon of the level detection circuit 33.

In the normal standby mode, the OSC control circuit 34 generates the oscillation frequency control signal VR with the predetermined voltage when the entry signal NAPe goes low, and the level detection circuit 33 generates the detection signal mon at a low level. The NOR circuit 58 causes its output signal to go high in response to the low detection signal mon. The inverter circuit 57 inverts the output signal of the NOR circuit 58 and provides the low inverted signal to the NOR circuit 25. In this case, the NOR circuit 25 functions as a logic inverting circuit, and the inverter circuits 21 and 22 and the NOR circuit 25 function as a ring oscillator.

In the nap mode, the NOR circuit 58 causes its output signal to go low when the entry signal NAPe goes high. The inverter circuit 57 inverts the output signal of the NOR circuit 58 and provides the high inverted signal to the NOR circuit 25 to stop the transmission of the oscillation signal OSC. In this state, the supply of power to the OSC control circuit 34 is stopped, and the voltage of the oscillation frequency control signal VR is decreased to the ground voltage VSS. When the voltage of the oscillation frequency control signal VR is decreased to a predetermined voltage or lower, the level detection circuit 33 generates the detection signal mon at a high level.

When the mode returns from the nap mode to the normal mode, the low entry signal NAPe supplies power to the OSC control circuit 34 and increases the oscillation frequency control signal to a predetermined voltage. The detection signal mon of the detection circuit 33 remains high during a transitional period in which the oscillation frequency control signal VR is unstable. The detection signal mon stops the output of the oscillation signal OSC. Subsequently, the detection signal mon goes low when the oscillation frequency control signal VR reaches the predetermined voltage. This restarts the output of the oscillation signal OSC. In this embodiment, the oscillation signal OSC is generated with a stable oscillation frequency during the transitional period in which the oscillation frequency control signal VR is unstable.

The present examples and embodiments are to be considered as illustrative and not restrictive, and the invention is not to be limited to the details given herein, but may be modified within the scope and equivalence of the appended claims.

What is claimed is:

1. A semiconductor memory device, which performs refreshing for data retention, provided with a power down mode that stops refreshing, the device comprising:
    an oscillation circuit for generating an oscillation signal; and
    a request generation circuit for generating a refresh request signal with the oscillation signal of the oscillation circuit, wherein the oscillation circuit stops generation of the oscillation signal in response to a power down mode entry signal.

2. The device according to claim 1, wherein after the oscillation circuit generates a final oscillation signal in response to the power down mode entry signal, the oscillation circuit stops the generation of a new oscillation signal, and when the power down mode entry signal is invalidated, the oscillation circuit generates the oscillation signal synchronously with the invalidation.

3. The device according to claim 1, wherein the oscillation circuit includes a logic gate for stopping the generation of the oscillation signal in response to the power down mode entry signal.

4. The device according to claim 3, wherein the logic gate includes a NOR circuit.

5. The device according to claim 1, further comprising:
    an oscillation control circuit connected to the oscillation circuit to generate a control signal for controlling the frequency of the oscillation signal; and
    a transistor for cutting the supply of power to the oscillation control circuit in response to the power down mode entry signal.

6. The device according to claim 5, wherein the oscillation control circuit generates either one of a constant current control signal and a constant voltage control signal.

7. The device according to claim 5, further comprising:
    a level detection circuit connected to the oscillation control circuit to detect the voltage level of the control signal and generate a detection signal.

8. The device according to claim 7, further comprising:
    a switch connected to the oscillation circuit and the level detection circuit to selectively provide the oscillation signal to the request generation circuit in response to the detection signal.

9. The device according to claim 7, wherein the request generation circuit includes a cycle counter for counting the oscillation signal of the oscillation circuit, the device further comprising:
    a switch circuit connected between the oscillation circuit and the cycle counter to selectively provide the oscillation signal to the cycle counter in response to the detection signal.

10. The device according to claim 7, wherein the oscillation circuit includes a logic gate for stopping the generation of the oscillation signal in response to the power down mode entry signal and the detection signal.

11. The device according to claim 10, wherein the logic gate includes a NOR circuit.

12. The device according to claim 5, further comprising:
    a preset unit connected to an output of the oscillation control circuit to provide the output of the oscillation control circuit with a further control signal, which has a predetermined voltage, in response to the power down mode entry signal.

13. The device according to claim 12, wherein the predetermined voltage is substantially equal to the voltage of the control signal.

14. The device according to claim 12, wherein the oscillation circuit includes a logic gate for stopping the generation of the oscillation signal in response to the power down mode entry signal.

15. The device according to claim 12, further comprising:
    an oscillator for generating the further control signal and for generating a further oscillation signal in accordance with the further control signal; and
    a voltage generation circuit connected to the oscillator to generate internal power supply voltage with the further oscillation signal.

16. The device according to claim 15, further comprising:
    a switch circuit for cutting the supply of power to the oscillator and the voltage generation circuit in response to a further power down mode entry signal.

17. A semiconductor memory device comprising:
    a power down control circuit for generating a power down mode entry signal; and
    a refresh control circuit for generating a refresh request signal for the semiconductor memory device, the refresh control circuit including:
        an oscillation circuit for generating an oscillation signal;
        an oscillation control circuit connected to the oscillation circuit to generate a control signal for controlling the frequency of the oscillation signal;
        a cycle counter for counting the oscillation signal of the oscillation circuit; and
        a request generation circuit connected to the cycle counter to generate the refresh request signal in accordance with a count value, wherein the oscillation circuit stops generation of the oscillation signal in response to the power down mode entry signal.

18. The device according to claim 17, wherein, after the oscillation circuit generates a final oscillation signal in response to the power down mode entry signal, the oscillation circuit stops the generation of a new oscillation signal, and when the power down mode entry signal is invalidated, the oscillation circuit generates the oscillation signal synchronously with the invalidation.

19. The device according to claim 17, further comprising:
    a first switch circuit for cutting the supply of power to the oscillation control circuit in response to the refresh request signal;
    a level detection circuit connected to the oscillation control circuit to detect the voltage level of the control signal and generate a detection signal; and
    a second switch circuit connected between the oscillation circuit and the cycle counter to selectively provide the oscillation signal to the cycle counter in response to the detection signal.

20. The device according to claim 17, further comprising:
a first switch circuit for cutting the supply of power to the oscillation control circuit in response to the refresh request signal; and
a preset unit connected to an output of the oscillation control circuit to provide the output of the oscillation control circuit with a further control signal, which has a predetermined voltage, in response to the power down mode entry signal.

21. The device according to claim 20, further comprising:
an oscillator for generating the further control signal and for generating a further oscillation signal in accordance with the further control signal;
a voltage generation circuit connected to the oscillator to generate internal power supply voltage with the further oscillation signal; and
a second switch circuit for cutting the supply of power to the oscillator and the voltage generation circuit in response to a further power down mode entry signal.

22. The device according to claim 21, wherein the power down mode is a refresh stopping mode, and the further power down mode is a sleep mode.

23. A method for controlling a semiconductor memory device provided with a normal mode, in which refreshing is periodically performed, and a power down mode, in which refreshing is stopped, wherein the semiconductor memory device includes a refresh control circuit for performing an oscillation operation and generating a refresh request signal, the method comprising the steps of:
shifting the mode from the normal mode to the power down mode;
stopping the generation of the refresh request signal by stopping the oscillation operation of the refresh control circuit during the power down mode;
returning the mode from the power down mode to the normal mode; and
generating the refresh request signal by starting the oscillation operation of the refresh control circuit during the normal mode.

24. The method according to claim 23, wherein the semiconductor memory device includes an internal power generation circuit for generating internal power supply voltage, and the step for stopping the generation of the refresh request signal includes activating the internal power generation circuit during the power down mode.

25. The method according to claim 23, wherein the refresh control circuit includes an oscillation circuit for performing an oscillation operation and generating an oscillation signal, and the step for stopping the generation of the refresh request signal includes stopping the oscillation operation of the oscillation circuit.

26. The method according to claim 25, wherein the refresh control circuit includes an oscillation control circuit connected to the oscillation circuit to generate a control signal for controlling the frequency of the oscillation signal, and wherein the step for stopping the generation of the refresh request signal includes stopping the generation of the control signal by cutting the supply of power to the oscillation control circuit.

27. The method according to claim 26, further comprising the steps of:
detecting the voltage of the control signal; and
permitting the output of the oscillation signal from the oscillation circuit when the detected voltage reaches a predetermined voltage.

28. The method according to claim 23, wherein the semiconductor memory device includes an internal power generation circuit for generating internal power supply voltage by performing an oscillation operation in accordance with a first control signal having a predetermined voltage, wherein the refresh control circuit includes an oscillation circuit for performing an oscillation operation and generating an oscillation signal, and an oscillation control circuit connected to the oscillation circuit to generate a second control signal for controlling the frequency of the oscillation signal, wherein the step for stopping the generation of the refresh request signal includes stopping the generation of the second control signal by cutting the supply of power to the oscillation control circuit, the method further comprising the step of:
providing the first control signal of the internal power generation circuit to an output of the oscillation control circuit in the power down mode.

* * * * *